US008289036B2

(12) United States Patent
Bataille et al.

(10) Patent No.: US 8,289,036 B2
(45) Date of Patent: Oct. 16, 2012

(54) DEVICE FOR NEUTRALIZING AN ELECTRIC SWITCHING UNIT

(75) Inventors: Christian Bataille, Voiron (FR); Charles Blondel, Grenoble (FR); Jose Desforges, Seyssins (FR); Stephane Follic, Grenoble (FR); Didier Vigouroux, Villard Bonnot (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 1108 days.

(21) Appl. No.: 12/067,866

(22) PCT Filed: Sep. 21, 2006

(86) PCT No.: PCT/EP2006/066581
§ 371 (c)(1), (2), (4) Date: Aug. 4, 2008

(87) PCT Pub. No.: WO2007/036481
PCT Pub. Date: Apr. 5, 2007

(65) Prior Publication Data

US 2009/0065343 A1 Mar. 12, 2009

(30) Foreign Application Priority Data

Sep. 23, 2005 (FR) ...................................... 05 52834

(51) Int. Cl.
*G01R 27/08* (2006.01)

(52) U.S. Cl. ......................... 324/700; 324/693; 324/722

(58) Field of Classification Search .................. 324/700
See application file for complete search history.

(56) References Cited

U.S. PATENT DOCUMENTS

| | | | |
|---|---|---|---|
| 4,146,766 A | 3/1979 | Forrester et al. | |
| 6,225,807 B1 * | 5/2001 | Pohl | 324/423 |
| 6,373,669 B1 * | 4/2002 | Hartmann et al. | 361/62 |
| 7,109,720 B2 * | 9/2006 | Baurand et al. | 324/421 |

FOREIGN PATENT DOCUMENTS

| | | |
|---|---|---|
| DE | 926 799 | 4/1955 |
| WO | 2004 057634 | 7/2004 |

OTHER PUBLICATIONS

Kummer, Hans, Device for watching over the erosion of the contacts of a switch, DE 926799, machine translation, p. 1-3.*

* cited by examiner

*Primary Examiner* — Thomas Valone
(74) *Attorney, Agent, or Firm* — Oblon, Spivak, McClelland, Maier & Neustadt, L.L.P.

(57) ABSTRACT

The invention relates to a device for neutralizing an electric switching unit. One or several power poles, each of which is provided with movable contacts separable form fixed contacts are actuatable between opened and closed positions by an actuator for switching-on an electric charge. A mechanical actuating device interacts with the movable contacts. It is used for actuating a device for neutralizing the electric switching unit by switching-off the control electric circuit thereof when the wear degree of pellets is greater than a predetermined threshold. The control circuit is switched-off, for example, by cutting a wire thereof. An electric switching unit is provided with the device.

14 Claims, 2 Drawing Sheets

DEVICE FOR NEUTRALIZING AN ELECTRIC SWITCHING UNIT

BACKGROUND

1. Field of the Invention

The present invention relates to a neutralization device for an electrical switching unit, such as a contactor, a starter or a contactor breaker, equipped with one or more power poles. The neutralization device is activated when the degree of erosion of the contacts for a pole is greater than a predetermined threshold. The invention also relates to an electrical switching unit including such a neutralization device.

An electrical switching unit such as a contactor has, at each power pole, movable contacts that are separable from stationary contacts, moved using a solenoid to switch an electrical load to be controlled. The pads mounted on the contacts erode more or less with each switching according to the current or voltage load. After a high number of operations, this erosion may lead to failure of the electrical switching unit, the consequences of which may be significant, especially in terms of safety. To prevent such consequences, one solution consists in systematically replacing either the contact pads or the electrical switching unit after a certain number of operations. In order to avoid replacement that is premature or too late, electrical switching units have been equipped with systems indicating to the user the real degree of erosion of the contact pads. In this way, the user is alerted at the desired moment of the end of the lifetime of the electrical unit, which allows failures of the electrical unit and the damages that these failures might cause to be prevented.

2. Related Art

In the patent applications WO 2004/057633, WO 2004/057635 or U.S. Pat. No. 6,225,807 electrical switching units are equipped with devices indicating to a user the degree of erosion of the contact pads of the unit. For example, in the patent application WO 2004/057635 the remaining lifetime of the contactor is determined from the variation in the contact force exerted by the spring in the course of time to hold the movable contacts against the stationary contacts when the contacts are closed. In U.S. Pat. No. 6,225,807 the remaining lifetime of contact pads is determined by calculating a modification of the contact pressure during an operation of opening the contacts.

The systems described in these documents only allow an indication to be given to the user and do not protect against the possible dangers if the unit continues to be used when the contact pads have reached a high degree of erosion.

SUMMARY OF THE INVENTION

The aim of the invention is therefore to propose a device allowing certain avoidance of all risks or damage caused by the electrical switching unit when its contact pads have reached too high a degree of erosion.

This aim is attained by a device for neutralizing an electrical switching unit which comprises one or more power poles, each equipped with movable contacts that are separable from stationary contacts and moved by an electrically controlled actuator between an open position and a closed position to switch an electrical load, said device being characterized in that it comprises mechanical means of movement cooperating with the movable contacts and able to move the means of neutralizing the electrical switching unit, said neutralization means cutting off an electrical circuit that controls the actuator when the degree of erosion of the contact pads is greater than a predetermined threshold.

According to a first embodiment, the cutting-off of the circuit that controls the actuator is effected by severing a control circuit wire. The severing of the wire therefore causes the cutting-off of the electrical supply to the actuator and therefore takes the electrical switching unit out of operation.

According to a first configuration of this first embodiment, the neutralization means comprise an abruptly transforming bistable elastic membrane. This membrane is set up so as to retract abruptly under the action of the means of movement when the erosion of the contacts becomes too high. Advantageously, the neutralization means comprise at least one cutting blade attached to the elastic membrane. When the membrane abruptly retracts, this cutting blade is therefore propelled sufficiently hard to sever the control circuit wire. To improve the efficiency of the device, the control circuit wire may be brought against a stationary second cutting blade.

According to a second configuration of this first embodiment, the neutralization means comprise an instrument for receiving the control circuit wire and stretching it according to the erosion of the contact pads until it is severed when the degree of erosion of the contact pads is greater than the predetermined threshold.

According to a second embodiment, the cutting-off of the control circuit is effected by opening the control circuit. According to a distinctive feature of this second embodiment, the neutralization means comprise an abruptly transforming bistable elastic membrane. The elastic membrane carries, for example, an instrument able to open the control circuit. The elastic membrane plays the same role as in the first configuration of the first embodiment, but it no longer carries a cutting blade but a simple instrument allowing, for example, a flexible blade to be pushed to open the control circuit of the actuator.

According to the invention, the mechanical means of movement mentioned above comprise, for example, a movable piston, moved in translation, according to the erosion of the contact pads, by the movable contacts when the contacts are in the closed position.

Advantageously, the piston is fitted on a guiding device. The guiding device comprises, for example, flexible strips pressing against the piston and able to keep it in its position. The flexible strips thus form notches marking the successive positions of the piston according to the erosion of the contact pads.

According to the invention, the electrically controlled actuator used in the electrical unit is, for example, a solenoid comprising a control coil. In this case, the severed wire might be, for example, the wire of the control coil or a wire of the supply circuit for this coil.

The aim of the invention is also attained by an electrical switching unit comprising one or more power poles, each equipped with movable contacts that are separable from stationary contacts and moved by an electrically controlled actuator between an open position and a closed position to switch an electrical load, the device being characterized in that it comprises a neutralization device as described above.

According to a distinctive feature of this electrical switching unit, the movable contacts are mounted on a bridge that is movable in translation and able to move a piston in translation according to the erosion of the contact pads when the contacts are in the closed position.

BRIEF SUMMARY OF THE DRAWINGS

Other features and advantages will become apparent in the following detailed description with reference to an embodiment, given by way of example, and shown by the appended drawings in which.

DETAILED DESCRIPTION

Figure 1A:
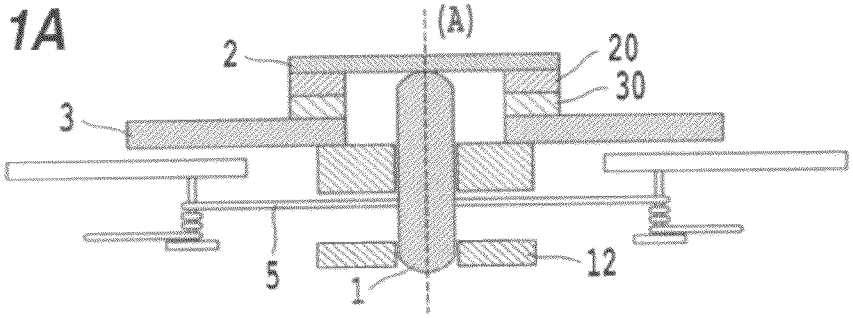
FIGS. 1A and 1B show, in a simplified manner, the device according to a first embodiment of the invention, when the pads are new and when they have reached a high degree of erosion respectively.

In a known way, an electrical switching unit such as an electromechanical contactor, contactor breaker or starter comprises one or more power poles, for example three power poles.

An electrical switching unit comprises upstream current lines (source lines) which establish electrical continuity between the electric supply network and the power poles, and downstream current lines (load lines) which establish electrical continuity between poles of the electrical switching unit and an electrical load, generally an electrical motor that it is desired to control and/or protect by means of the electrical switching unit. The upstream current lines are connected to or disconnected from the downstream current lines by pole contacts. The poles may be single break or double break. On the appended figures the pole is double break and comprises movable contact pads 20 arranged on a movable bridge 2 and stationary contact pads 30 arranged on stationary contacts 3. The movable bridge 2 is moved along a principal axis (A) by an electrically controlled actuator. An electrically controlled actuator may, for example, be:

- of an electromagnetic type, such as a control solenoid for example. The control solenoid typically comprises a stationary yoke, a movable armature, a return spring and a control coil. The movement closing the movable armature is generated by passing an excitation current through the control coil;
- of a piezoelectric type;
- of a magnetostrictive type. When subjected to a magnetic field, a magnetostrictive material undergoes an induced mechanical deformation.

In the rest of the description, we will use the term “electrical actuator” to designate an electrically controlled actuator.

The invention consists in neutralizing an electrical switching unit when the degree of erosion of the contact pads 20, 30 of at least one pole becomes greater than a predetermined threshold, that is, when their erosion becomes too great. Several solutions allow this result to be reached.

In these solutions the movable bridge 2 of each of the power poles cooperates with the mechanical means of movement when the contacts are closed. According to the erosion of the contact pads 20, 30 of the pole, the movable bridge 2 thus presses against the first end of a piston 1. The position of the piston 1 therefore reflects the state of erosion of the contact pads 20, 30.

Figure 5A:
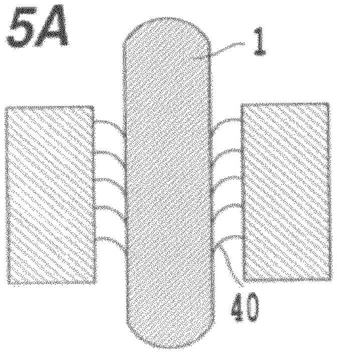
FIGS. 5A and 5B show two guiding devices for the piston capable of being used in the device according to the invention.

The piston 1 is guided in translation along the principal axis (A) by a guiding device comprising, for example, flexible strips 40 (FIG. 5A) pressing against the external surface of the piston 1 and keeping piston 1 in the position reflecting the state of erosion of the contacts, even when the contacts are open.

Figure 5B:
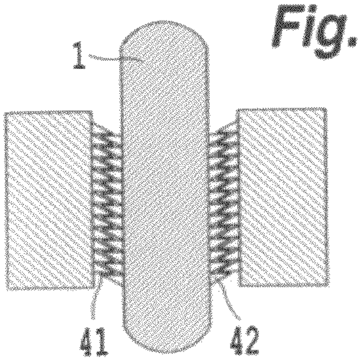

Flexible strips 41 in the form of teeth (FIG. 5B) may cooperate with corresponding flexible strips 42 standing up against the external surface of the piston 1, the cooperation between the strips 41, 42 creating notches successively marking different positions of the piston 1 during its translation and keeping the piston 1 in its position when the contacts are open.

In the embodiments described below a “control circuit wire”, or a wire of the circuit controlling the electrical actuator, is understood to be a wire connecting the electrical actuator with its current source, a wire of the electrical actuator itself, such as a wire of the control coil when the actuator is a solenoid, or a power wire of the control circuit for the electrical actuator.

In the embodiments described below, the electrical actuator is, for example, a conventional solenoid comprising a control coil supplied by a current source via the electrical control circuit (designated subsequently “control circuit”).

According to a first embodiment of the invention (FIGS. 1A to 2B), the neutralization of the electrical switching unit is produced in a first configuration by cutting a wire 5 of the control circuit or in a second configuration by cutting a wire supplying an alarm circuit.

Figure 2A:
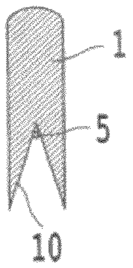
FIGS. 2A and 2B show two possible configurations of the piston used in the device according to the first embodiment.
Figure 2B:
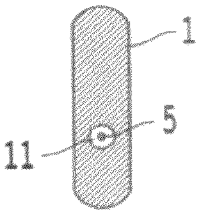

In the first configuration, a part of the control circuit wire 5 is stretched in a direction perpendicular to the principal axis (A). The piston 1 comprises a slot 10 into which the control circuit wire 5 is inserted (FIG. 2A) or an opening 11 through which the control circuit wire 5 passes (FIG. 2B). In order to concentrate the force of piston 1 in an area of the control circuit wire 5, the piston 1 is able to be translated across a support 12 placed below the control circuit wire 5.

Figure 1B:
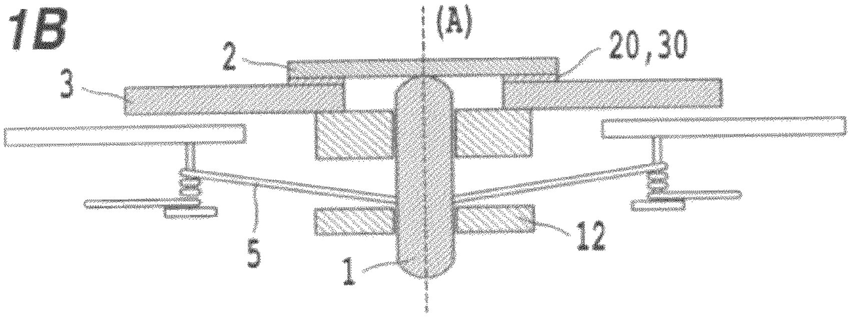

According to the erosion of the contact pads 20, 30, the piston 1 therefore presses against the control circuit wire 5 (FIG. 1B). When the degree of erosion of the contact pads 20, 30 is high and greater than a predetermined threshold, the tension in the wire 5 is too high and it breaks. With the control circuit of the electrical actuator then being cut off, the electrical switching unit is therefore neutralized.

In the second configuration, instead of completely neutralizing the electrical switching unit, the user may simply be alerted of the state of erosion of the contact pads 20, 30 of the unit. In this configuration, the cutting of the control circuit wire 5 is therefore replaced by that of a wire supplying an alarm circuit. So long as the wire is not severed, the alarm is inactive. When the wire is severed by being cut by the piston 1, as described in the first configuration, the user receives a piece of information, for example visually (an indicator light goes out), indicating that the contact pads 20, 30 are worn out and that the electrical switching unit should be replaced.

According to a second embodiment, the second end of the piston 1 comes to press against the neutralization means, comprising, for example, an abruptly transforming bistable elastic membrane 6 that can move between a high position and a low position. When the contacts are closed, the piston 1 is therefore carried between the movable bridge 2 and the elastic membrane 6 in the high position.

The flexible strips 40, 41, 42 of the guiding device oppose the return constraint exerted by the elastic membrane 6, in order to keep the piston 1 in its position corresponding to the real erosion of the contact pads 20, 30, even when the contacts are open.

The retraction of the elastic membrane 6 occurs in the direction of translation of the piston 1. When the piston 1 reaches a position corresponding to a degree of erosion of the contact pads 20, 30 greater than a predetermined threshold, the membrane 6 reaches a critical position and abruptly retracts, generating a strong and irreversible mechanical movement.

In a first configuration of this second embodiment (FIGS. 3A and 3B), a part of the control circuit wire 5 is stretched in a direction perpendicular to the principal axis (A) and is positioned within range of the elastic membrane 6.

Figure 3A:
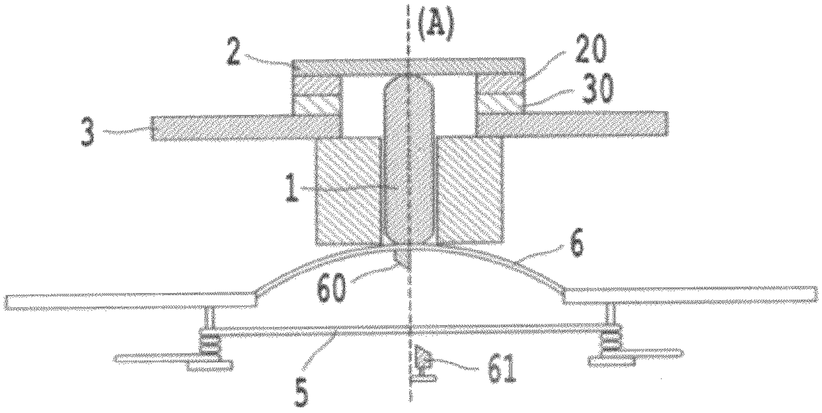
FIGS. 3A and 3B show a first configuration of the neutralization device according to a second embodiment of the invention, when the contact pads are new and when they have reached a high degree of erosion respectively.
Figure 3B:
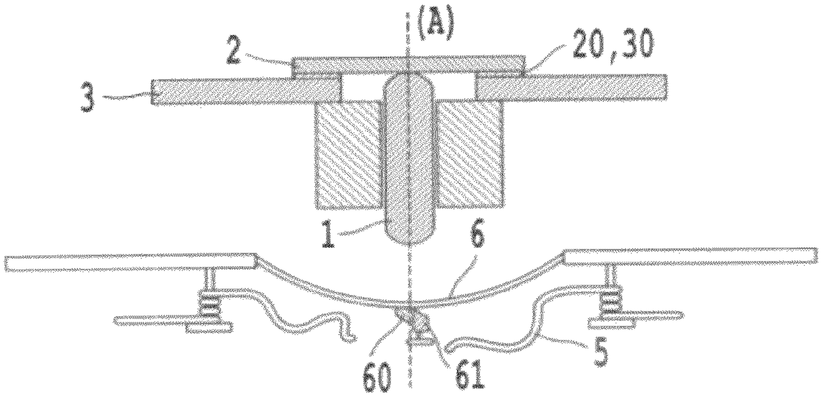

The elastic membrane 6 carries, for example, a cutting blade 60 drawn along in translation according to the erosion of the contact pads 20, 30. When the contact pads 20, 30 are new, the membrane 6 is in the high position (FIG. 3A). When the degree of erosion of the contact pads 20, 30 is greater than a predetermined threshold, the elastic membrane 6, pushed by the piston 1, reaches its critical position and retracts, rapidly drawing the cutting blade 60 in translation until this slices through the control circuit wire 5 (FIG. 3B). In order to guarantee the cutting of the control circuit wire 5, a stationary second blade 61, playing the role of scissors, may be positioned below the control circuit wire 5, slightly offset in relation to the first blade 60.

In a second configuration of the second embodiment (not shown), instead of neutralizing the electrical switching unit, the user may be alerted of the state of erosion of the contact pads 20, 30 of the unit. In this configuration, the cutting of the control circuit wire 5 is replaced by that of a wire supplying an alarm circuit. So long as the wire is not severed, the alarm is inactive. When the wire is severed by being cut by the cutting blade 60, the user receives a piece of information, for example visually (an indicator light goes out), indicating that the contact pads 20, 30 are worn out and that the electrical switching unit should be replaced.

Figure 4A:
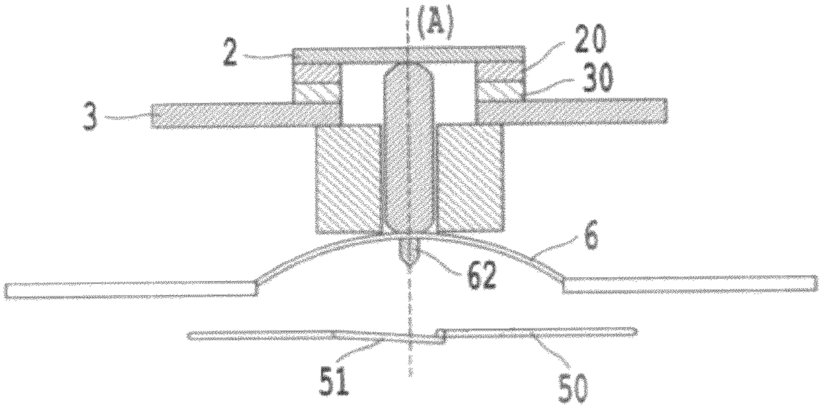
FIGS. 4A and 4B show another configuration of the neutralization device according to the second embodiment of the invention, when the contact pads are new and when they have reached a high degree of erosion respectively.
Figure 4B:
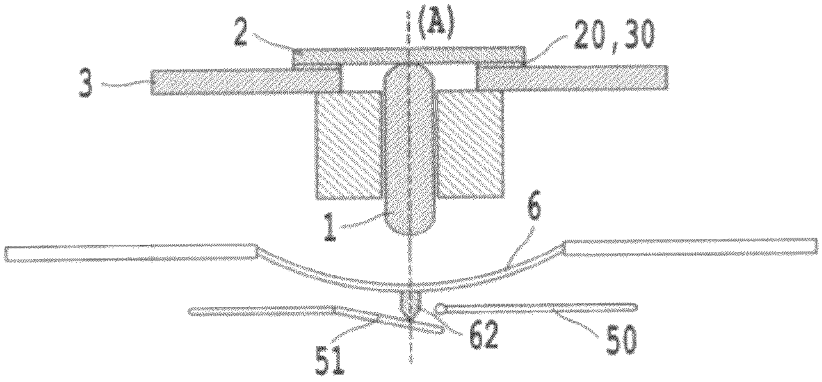

In a third configuration of the second embodiment (FIGS. 4A and 4B) the abruptly transforming bistable elastic membrane 6 has a pin 62 designed to open the control circuit 50 of the electrical actuator. The control circuit 50 of the electrical actuator is, for example, closed by means of a flexible blade 51. When the contacts are closed and the contact pads 20, 30 are new, the piston 1 is in the high position, as is the elastic membrane 6 (FIG. 4A). When the contact pads 20, 30 are eroded and have reached a high degree of erosion, greater than a predetermined threshold, the elastic membrane 6, having reached its critical position, retracts. The pin 62 carried by the membrane 6 then presses against the flexible blade 51 to move it away and so to open the control circuit 50 of the electrical actuator (FIG. 4B).

In a final configuration, instead of neutralizing the unit by opening the control circuit, as in the second configuration of this second embodiment, the user is simply alerted of the state of erosion of the contact pads 20, 30 of the unit. In this final configuration, the opening of the control circuit 50 by the pin 62 is replaced solely by opening an alarm circuit realized using this same pin 62. When the alarm circuit is open, the user receives a piece of information, for example visually (an indicator light goes out), indicating that the contact pads 20, 30 are worn out and that the electrical switching unit should be replaced. According to a variant embodiment, the opening of the alarm circuit may be replaced completely by the closing of an alarm circuit. In this case, the pin 62 presses against the flexible blade 51 not to move it away, but to bring it closer to the circuit until the alarm circuit is completely closed.

It is understood that other variations and improvements in detail may be imagined, and even the use of equivalent means envisioned, without departing from the scope of the invention.

The invention claimed is:

1. A device for neutralizing an electrical switching unit which comprises one or more power poles, each equipped with movable contacts that are separable from stationary contacts and moved by an electrically controlled actuator between an open position and a closed position to switch an electrical load, the device comprising:
- a mechanical movement device cooperating with the movable contacts and configured to move an electrical switching neutralizing unit, wherein
- the neutralizing unit is configured to cut off an electrical circuit that controls the actuator when a degree of erosion of the contact pads is greater than a predetermined threshold, and
- the neutralizing unit comprises an abruptly transforming bistable elastic membrane.

2. The device as claimed in claim 1, wherein the cutting-off of the circuit that controls the actuator is effected by severing a control circuit wire.

3. The device as claimed in claim 2, wherein the neutralizing unit comprises at least one cutting blade attached to the elastic membrane.

4. The device as claimed in claim 3, wherein the neutralizing unit comprises a stationary second cutting blade against which the control circuit wire is configured to be brought.

5. The device as claimed in claim 1, wherein the cutting-off of the control circuit is effected by opening the control circuit.

6. The device as claimed in claim 5, wherein the elastic membrane carries an instrument configured to open the control circuit.

7. The device as claimed in claim 1, wherein the mechanical movement device comprises a movable piston, moved in translation, responsive to erosion of the contact pads, when the contact pads are in the closed position.

8. The device as claimed in claim 7, wherein the piston is fitted on a guiding device.

9. The device as claimed in claim 1, wherein the actuator is a solenoid comprising a control coil.

10. An electrical switching unit comprising one or more power poles, each equipped with movable contacts that are separable from stationary contacts and moved by an electrically controlled actuator between an open position and a closed position to switch an electrical load, wherein the switching unit comprises:
- a neutralizing device as claimed in claim 1.

11. The electrical switching unit as claimed in claim 10, wherein the movable contacts are mounted on a bridge that is movable in translation and configured to move a piston in translation according to the erosion of the contact pads when the contacts are in the closed position.

12. A device for neutralizing an electrical switching unit which comprises one or more power poles, each equipped with movable contacts that are separable from stationary contacts and moved by an electrically controlled actuator between an open position and a closed position to switch an electrical load, the device comprising:
- a mechanical movement device cooperating with the movable contacts and configured to move an electrical switching neutralizing unit, wherein
- the neutralizing unit is configured to cut off an electrical circuit that controls the actuator when a degree of erosion of the contact pads is greater than a predetermined threshold,
- the cutting-off of the circuit that controls the actuator is effected by severing a control circuit wire, and
- the neutralizing unit comprises an instrument for receiving the control circuit wire and stretching the control circuit wire according to the erosion of the contact pads until the control circuit wire is severed when the degree of erosion of the contact pads is greater than the predetermined threshold.

13. A device for neutralizing an electrical switching unit which comprises one or more power poles, each equipped with movable contacts that are separable from stationary contacts and moved by an electrically controlled actuator between an open position and a closed position to switch an electrical load, the device comprising:

a mechanical movement device cooperating with the movable contacts and configured to move an electrical switching neutralizing unit, wherein the neutralizing unit is configured to cut off an electrical circuit that controls the actuator when a degree of erosion of the contact pads is greater than a predetermined threshold, the mechanical movement device comprises a movable piston, moved in translation, responsive to erosion of the contact pads, when the contact pads are in the closed position, the piston is fitted on a guiding device, and the guiding device comprises flexible strips pressing against the piston and configured to keep the piston in its position.

14. The device as claimed in claim 13, wherein the flexible strips form notches marking the successive positions of the piston according to the erosion of the contact pads.

* * * * *